(12) United States Patent
Lee (10) Patent No.: US 9,013,261 B2
(45) Date of Patent: Apr. 21, 2015

(54) HIGH-POWER VARIABLE INDUCTOR AND FILTER EMPLOYING SAME

(71) Applicant: PSTEK Co., Ltd., Anyang-si (KR)

(72) Inventor: Jae Taek Lee, Gunpo-si (KR)

(73) Assignee: PSTEK Co., Ltd., Anyang-si (KR)

( * ) Notice: Subject to any disclaimer, the term of this patent is extended or adjusted under 35 U.S.C. 154(b) by 0 days.

(21) Appl. No.: 14/095,544

(22) Filed: Dec. 3, 2013

(65) Prior Publication Data
US 2014/0152412 A1 Jun. 5, 2014

(30) Foreign Application Priority Data

Dec. 3, 2012 (KR) .................. 10-2012-0138666

(51) Int. Cl.
| | | |
|---|---|---|
| H01F 27/28 | (2006.01) | |
| H01F 30/14 | (2006.01) | |
| H01F 21/04 | (2006.01) | |
| H03H 7/00 | (2006.01) | |
| H01F 21/12 | (2006.01) | |
| H03H 7/42 | (2006.01) | |
| H03H 7/075 | (2006.01) | |

(52) U.S. Cl.
CPC ............... *H03H 7/00* (2013.01); *H01F 21/12* (2013.01); *H03H 7/425* (2013.01); *H03H 7/075* (2013.01)

(58) Field of Classification Search
CPC ....... H01F 21/00; H01F 21/005; H01F 21/04; H01F 29/00; H01F 29/08; H01F 29/10; H01F 29/12
USPC .............. 336/65, 182, 10, 220, 232, 142, 146
See application file for complete search history.

(56) References Cited

U.S. PATENT DOCUMENTS

2012/0161870 A1* 6/2012 Leong et al. .................. 330/253

FOREIGN PATENT DOCUMENTS

| JP | 2000-114907 A | 4/2000 |
| JP | 2000-223318 A | 8/2000 |

* cited by examiner

*Primary Examiner* — Mangtin Lian
(74) *Attorney, Agent, or Firm* — Sughrue Mion, PLLC (57) ABSTRACT

The present disclosure provides a high-power variable inductor and a filter employing the same. A provided variable inductor comprises a first inductor and a second inductor. The first inductor is connected to a first input terminal and to a first output terminal of a two-port circuit. The second inductor is connected to a second input terminal and to a second output terminal of the two-port circuit. The first inductor and the second inductor are symmetrical to each other and jointly surround an adjustable area for varying an inductance of the variable inductor.

8 Claims, 7 Drawing Sheets

HIGH-POWER VARIABLE INDUCTOR AND FILTER EMPLOYING SAME

RELATED APPLICATIONS

The present application is based on, and claims priority from, Korean Patent Application Number 10-2012-0138666, filed Dec. 3, 2012, the disclosure of which is hereby incorporated by reference herein in its entirety.

TECHNICAL FIELD

The present disclosure in some embodiments relates to a high-power variable inductor and a filter employing the same. More particularly, the present disclosure relates to a high-power variable inductor for removing a high-frequency noise when supplying power to measuring equipment such as a high-power MRI (magnetic resonance imaging) device, and a filter employing the same.

BACKGROUND

The statements in this section merely provide background information related to the present disclosure and may not constitute prior art.

High-power measuring instrument or medical device is susceptible to damage or malfunction due to a high-frequency noise due to an impulse applied to the input power. Therefore, high-power equipment is generally manufactured by way of inserting a filter between the apparatus and a power source to remove the high-frequency noise. A low-pass filter removes the high-frequency noise by using an inductor as a principal component. With the high power applied, the inductor typically needs to maintain a low resistance. However, inductors usually have high resistance and it is difficult to adjust their magnitude.

Therefore, a high-power rated variable inductor and a filter using it are in practical need.

SUMMARY

In accordance with some embodiments, a variable inductor comprises a first inductor and a second inductor. The first inductor is connected to a first input terminal and to a first output terminal of a two-port circuit. The second inductor is connected to a second input terminal and to a second output terminal of the two-port circuit. The first inductor and the second inductor are symmetrical to each other and jointly surround an adjustable area for varying an inductance of the variable inductor.

Another embodiment of the present disclosure provides a low-pass filter comprise a first module and a second module. The first module is configured to have a predetermined number of indented conductive elements with a series of bends repeated in a row. The second module is configured to have the predetermined number of indented conductive elements with the inversion of the series of bends repeated in a row. The first module and the second module are arranged symmetrically by opposing each other.

| REFERENCE NUMERALS | |
|---|---|
| 120: Magnetic field | |
| 310: First support wire | 320: Second support wire |
| 330: First connecting wire | 335: Second connecting wire |
| 340: Third support wire | 350: Fourth support wire |
| 360: First module | 370: Second module |
| 410: First support plate | 420: Second support plate |
| 430: First connecting plate | 440: First output terminal |
| 450: First input terminal | 460: Second output terminal |
| 470: Second input terminal | 480: Third support plate |
| 490: Fourth support plate | 495: Second connecting plate |
| 610: Fastening member | 620: Fastening hole |
| 630: Ground plane | 710: Case |
| 720: Insulating plate | 730: Support |

DETAILED DESCRIPTION

The present embodiment resolves the fixation of an inductor inductance to provide a high-power variable inductor and a filter using thereof.

Hereinafter, at least one embodiment of the present disclosure will be described in detail with reference to the accompanying drawings.

In the following description, like reference numerals designate like elements, although the elements are shown in different drawings. Further, in the following description of the at least one embodiment, a detailed description of known functions and configurations incorporated herein will be omitted for the purpose of clarity and for brevity.

Additionally, in describing the components of the present disclosure, terms like first, second, A, B, (a), and (b) are used. These are solely for the purpose of differentiating one component from another, and one of ordinary skill would understand the terms are not to imply or suggest the substances, the order or sequence of the components. If a component is described as 'connected', 'coupled', or 'linked' to another component, one of ordinary skill in the art would understand the components are not necessarily directly 'connected', 'coupled', or 'linked' but also are indirectly 'connected', 'coupled', or 'linked' via a third component.

The present embodiment suggests an inductor which has four input/output terminals and is equivalent to a single-winding coil and a filter using such inductor. Then, the description will be provided on the valid reason for having four terminals rather than two with the typical inductors and accordingly controlling the inductance. For this purpose, the generally known concept of the inductor will be briefed before detailing the present embodiment.

Figure 1:
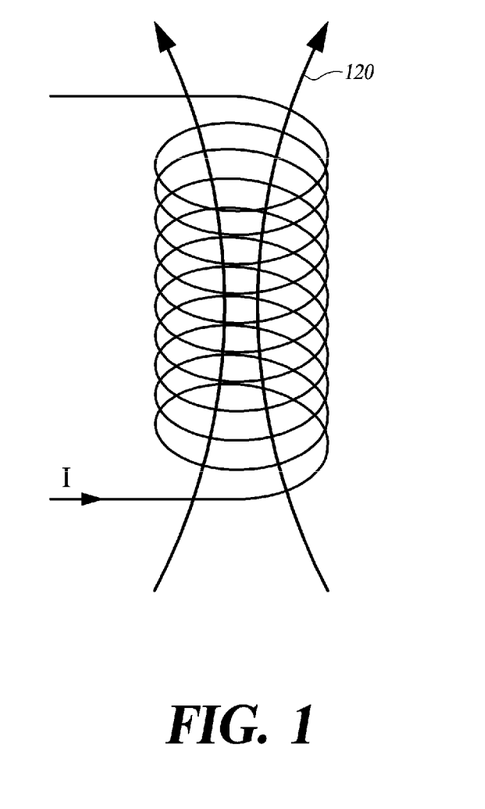
FIG. 1 is an exemplary diagram of a magnetic flux around the coil with a current flowing through it.

FIG. 1 is an exemplary diagram of the shape of a magnetic field around the coil with a current flowing through it.

Electric current induces a magnetic field 120. The magnetic field 120 produced by the current prevents a change in the current. The strength of resisting such change of current is called inductance. Taking advantage of its inductance to the current changes, an inductor is used as a low-pass filter (=high-frequency shielding filter) for blocking signals with large current changes or high frequencies, and used as a component of the low-pass filter.

According to Ampere's Law and the formula for magnetic flux, the inductance is proportional to the square of the turns of the conductor and to the cross-sectional area of the winding region. This is expressed by the inductance formula as Equation 1.

$$L = \frac{\lambda}{I} = \frac{\mu A N^2}{l} \quad \text{Equation 1}$$

Here, L represents inductance, λ magnetic flux interlinkage, I current, μ magnetic permeability, A the cross-sectional area of the winding region, N the number of turns and l the length of the closed loop.

Equation 1 is based on an assumption that the wire has no thickness and is wound in a cylindrical shape.

In general, a coil structure as shown in FIG. 1 in which the current enters the coil through one end of the coil and exits the coil through the other end of the coil is used as an inductor. The nature of inductor gives no special limitation in the number of inputs or outputs, only if the point that the same current should flow in the same direction.

Figure 2A:
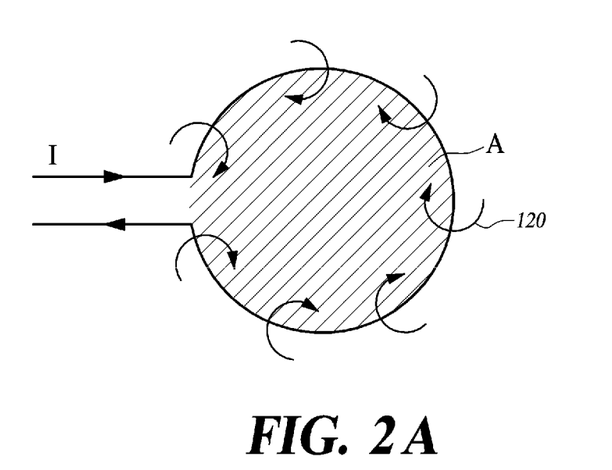
FIGS. 2A and 2B are exemplary diagrams of an inductor having a single winding and another inductor of an exemplary embodiment with four input/output terminals.
Figure 2B:
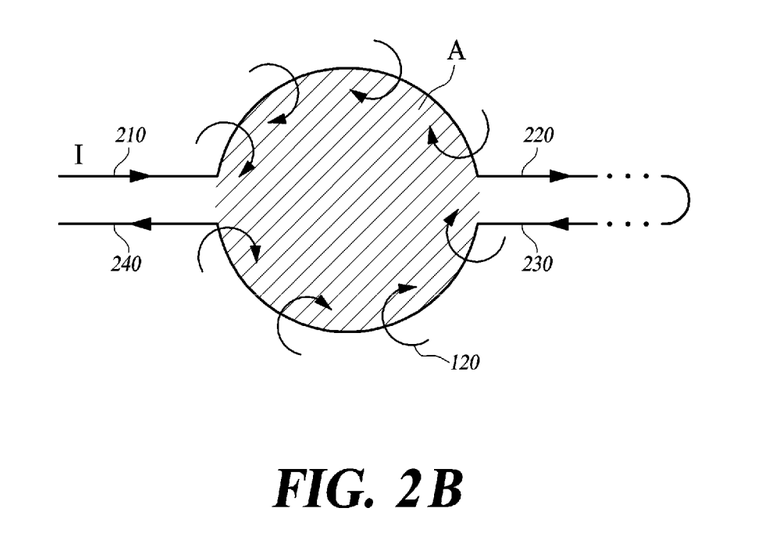

FIGS. 2A and 2B are exemplary diagrams of an inductor having a single winding and another inductor of an exemplary embodiment with four input/output terminals.

The inductor shown in FIG. 2A corresponds to an inductor having a single winding. When the current flows through only a single wire, a magnetic field 120 is induced. Therefore, Equation 1 is also applied to the inductor having a single winding. The hatched part A corresponds to the cross-sectional area of the winding region and the number of turns is 1. If the wires of the input terminal and the output terminal are sufficiently adjacent to each other, the cross-sectional area generated by the wires of the input and output terminals is negligible and thus makes no contribution to the inductance.

The inductor shown in FIG. 2B corresponds to an inductor having four input/output terminals formed by extending one end of the inductor having one turn. The inductor includes a first input terminal 210, a second input terminal 220, a second output terminal 230, and a first output terminal 240 arranged in sequence. The section corresponding to the dotted line between the second input terminal 220 and the second output terminal 230 corresponds to a circuit omitted in the drawing. As described above with reference to FIG. 2A, if the input or output wire makes no contribution to the inductance, the inductance depends only on the annular hatched area. The inductor shown in FIG. 2B generates the same magnetic flux and has the same inductance as the inductor shown in FIG. 2A. If the loop from the first input terminal 210 to the second input terminal 220 is symmetrical to the loop from the second output terminal 230 to the first output terminal 240, each of the inductance generated by the loop from the first input terminal 210 to the second input terminal 220 and the inductance generated by the loop from the second output terminal 230 to the first output terminal 240 is one half of the inductance generated by the inductor shown in FIG. 2A.

Figure 3:
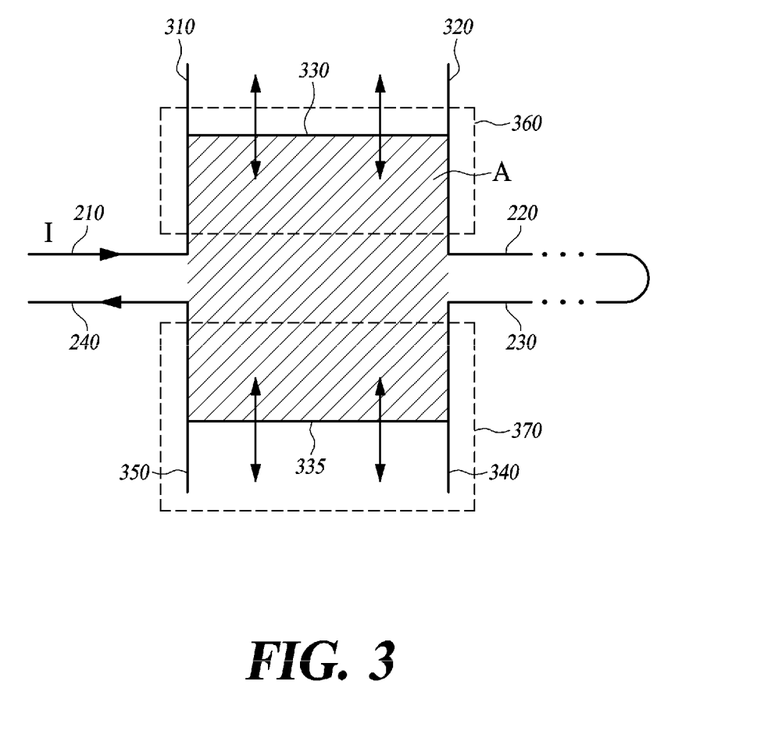
FIG. 3 is an exemplary diagram of a variable inductor according to at least one embodiment.

FIG. 3 illustrates an example of a variable inductor according to an embodiment.

The inductor shown in FIG. 3 is an embodiment, the cross-sectional area of which is adjustable, like the inductor shown in FIG. 2B. The inductor shown in FIG. 3 includes a first input terminal 210, a second input terminal 220, a second output terminal 230 and a first input terminal 240. Between the four input/output terminals 210-240, the inductor includes a first support wire 310, a second support wire 320, a first connecting wire 330, a second connecting wire 335, a third support wire 340, a fourth support wire 350, a first module 360, and a second module 370, which are arranged between the input terminals 210 and 240 and the output terminals 220 and 230. The first input terminal 210 is connected to one end of the first support wire 310 and the second input terminal 220 is connected to one end of the second support wire 320 with a predetermined space maintained between the first support wire 310 and the second support wire 320. Here, the first support wire 310 and the second support wire 320 are connected to each other while they are arranged in parallel to each other. The second output terminal 230 is connected to one end of the third support wire 340 and the first output terminal 240 is connected to one end of the fourth support wire 350 with a predetermined space maintained between the third support wire 340 and the fourth support wire 350. The third support wire 340 and the fourth support wire 350 are connected to each other while being arranged in parallel to each other. The other ends of the first support wire 310, the second support wire 320, the third support wire 340, and the fourth support wire 350 are not connected to one another. A first connecting wire 330 lies between the first support wire 310 and the second support wire 320 and a second connecting wire 335 is connected between the third support wire 340 and the fourth support wire 350, and the size and the shape of the cross-sectional area are determined according to the positions of the first connecting wire 330 and the fourth support wire 350. A closed loop is formed wherein the current enters the loop through the first input terminal 210, flows through the first module 360, the omitted circuit (the portion indicated by the dotted line between the second input terminal 220 and the second output terminal 230), and the second module 370, and then exits the loop through the first output terminal 240. In this event, the first module 360 and the second module 370 are magnetically coupled to each other. However, in terms of circuit, the first module and the second module are by two serially connected inductors with the omitted circuit (the portion indicated by the dotted line) as a space between them. If the first module 360 and the second module 370 have symmetric shapes to each other, they have the same inductance.

Figure 4:
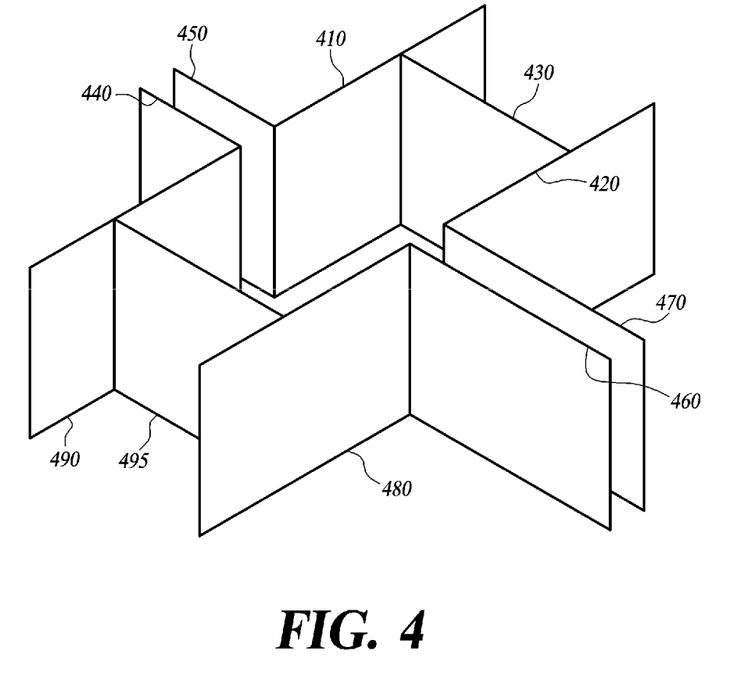
FIG. 4 is a perspective view of a variable inductor according to at least one embodiment.

FIG. 4 is a perspective view of a variable inductor according to an embodiment of the present disclosure.

Although the variable inductor shown in FIG. 3 is illustrated by lines, it does not necessarily have a linear shape. Especially, a thicker wire is more advantageous for a filter used for high power, because the thicker the wire, the lower the resistance. In the present embodiment, a structure using a plate shape is described. In the present embodiment, each of the input and output terminals also has a shape of a plate in consideration of the manufacture process and the flow of electric current. However, the present disclosure Is not limited to this shape.

A first support plate 410 connected to a first input terminal 450 and a second support plate 420 connected to a second input terminal 470 are disposed in parallel to each other, and a first connecting plate 430 is connected between the first support plate 410 and the second support plate 420. A third support plate 480 is connected to a second output terminal 460 while being placed on an extended plane of the second support plate 420, and a fourth support plate 490 is connected to a first output terminal 440 while being placed on an extended plane of the first support plate 410 and in parallel to the third support plate 480. Corresponding points of the first support plate 410 and the second support plate 420 are connected to each other through the first connecting plate 430, and corresponding points of the third support plate 480 and the fourth support plate 490 are connected to each other through a second connecting plate 495 placed in parallel to the first connecting plate 430 in the same manner. As a result of this connection, a module formed through the connection from the first input terminal 450 to the second input terminal 470 and a module formed through the connection from the second output terminal 460 to the first output terminal 440 are symmetric to each other. In other words, the present embodiment can implement an inductor including a first connecting plate 430 and a second connecting plate 495 which are symmetrically movable. As described above with reference to FIGS. 2 and 3, if two modules are symmetric, they have the same inductance. Herein, each of the input and output terminals should not necessarily be positioned at the ends of the support plate.

The inductance calculation formula of Equation 1 may be applied to the present embodiment, but Equation 1 is best applied to a linear coil wound in a circular shape and may thus have an error in this embodiment. The inductance of the present embodiment may be obtained through experiment or through simulation.

Figure 5:
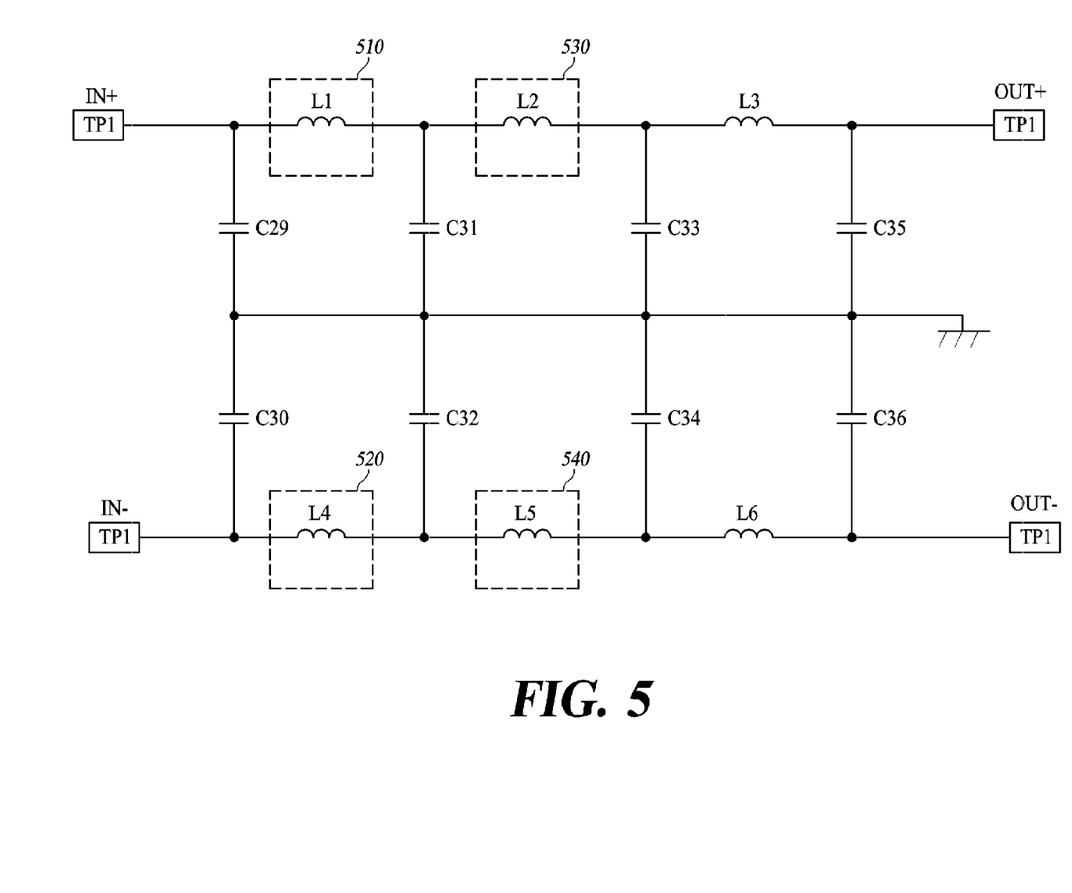
FIG. 5 is a circuit diagram of a low-pass filter according to at least one embodiment.

FIG. 5 is a circuit diagram of a low pass filter according to an embodiment of the present disclosure.

A power filter has input and output terminals of an input power connected to one side of the filter and input and output terminals of an output power connected to the other side of the filter. The first input terminal 450 and the first output terminal 440 described above with reference to FIG. 4 correspond to the input and output terminals of the input power and the second input terminal 470 and the second output terminal 460 correspond to the input and output terminals of the output power.

When the electric power is transferred by the two-port system as described above, a circuit from the input terminal of the input power to the input terminal of the output power and a circuit from the output terminal of the output power to the output terminal of the input power may be symmetrically configured so as to maintain the same phase. In the present embodiment, a low pass filter is designed. A 7th-order low pass filter has been designed by repeatedly implementing an inductor according to a typical low pass filter manufacturing technique and then connecting one end of a capacitor, the other end of which is grounded, to each of the inductors.

Meanwhile, the present embodiment suggests an inductor which can replace a conventional inductor. Therefore, the scope of the present disclosure should not be interpreted as limited to the circuit structure exemplified in the present embodiment. It is usual that a low pass filter is implemented within the 9th-order but there is no theoretical limit to the degree of order. The number of repetitions of serially-connected inductors and capacitors connected between the inductors determines the degree of order without any substantial change in the operation of the low pass filter. In other words, even an embodiment implementing a 5th order or 9th order low pass filter beyond the present embodiment should be interpreted as within the scope of the present disclosure.

The symmetrical inductors shown in FIGS. 2 through 4 can be employed in the filter illustrated in FIG. 5. L1 510, L4 520, L2 530, and L5 540 in FIG. 5 are inductors with the symmetric structure and thus have the same inductance. Description on a high frequency removal operation of a multiple order low pass filter is omitted here.

Figure 6:
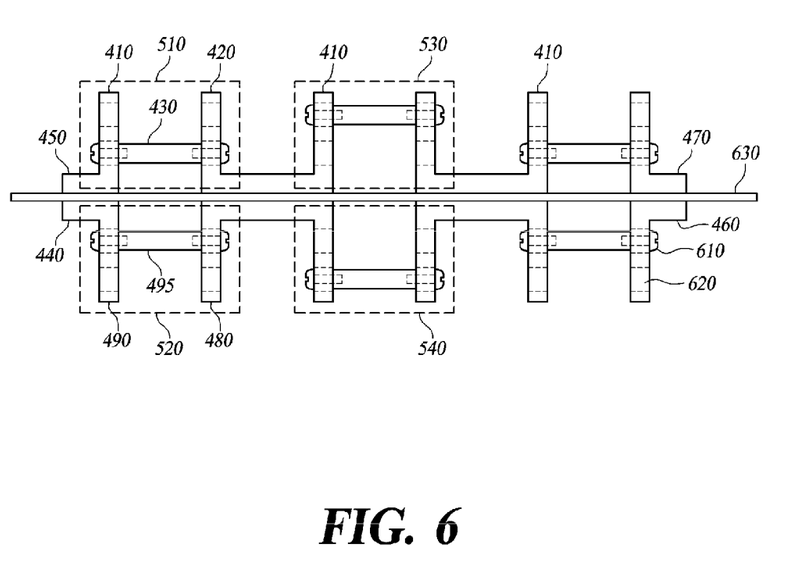
FIG. 6 is a plan view of a low-pass filter with a variable inductor according to at least one embodiment.

FIG. 6 is a plan view of a low pass filter using a variable inductor according to an embodiment of the present disclosure. FIG. 6 is a plan view in which only the inductor and the grounding line are implemented without the capacitor in the circuit diagram of FIG. 5.

The first support plate 410 and the second support plate 420 have fastening holes 620 for use in fastening the first connecting plate 430, which may be fastened to the fastening hole 620 by a fastening member 610. When there is a plurality of fastening holes 620, the position of the first connecting plate 430 may be adjusted. Further, the third support plate 480 and the fourth support plate 490 have fastening holes 620 for fastening the second connecting plate 495. When there is a plurality of fastening holes 620, the position of the second connecting plate 495 may be adjusted. In this event, it is preferred that the relative positions of the first connecting plate 430 and the second connecting plate 495 to the respective support plates are symmetrical to each other.

Once the low-pass filter is assembled, it includes a first module and a second module. As a conduit of electric current, the first module spans from the first input terminal 450 to the second input terminal 470 including junctions between the inductors and forming indented elements with a series of bends repeated along the length. The second module spans from the second output terminal 470 to the first output terminal 440 in symmetry to the first module and forms indented elements with the inversion of the first module series of bends repeated along the length in a row. Here, adjusting the inductance can be achieved by symmetrically moving the connecting plates that are protruding elements based on the line of symmetry. As noted, in the plan view, the area surrounded by the middle inductor is the largest, the areas surrounded by inductors at opposite ends are the same, and each of them is smaller than the largest area. Therefore, the middle inductor has the largest inductance and the inductors at the opposite ends have the same inductance smaller than the largest inductance.

The first module and the second module should be insulated from each other, and a ground plate 630 may thus be inserted between the first module and the second module. The ground plate 630 is a grounded conductive plate, and may serve as a structure for assembling the first module and the second module with each other wherein one end of a capacitor (not shown) having the other end connected to adjacent surfaces of the first module and the second module is connected to the structure.

Figure 7:
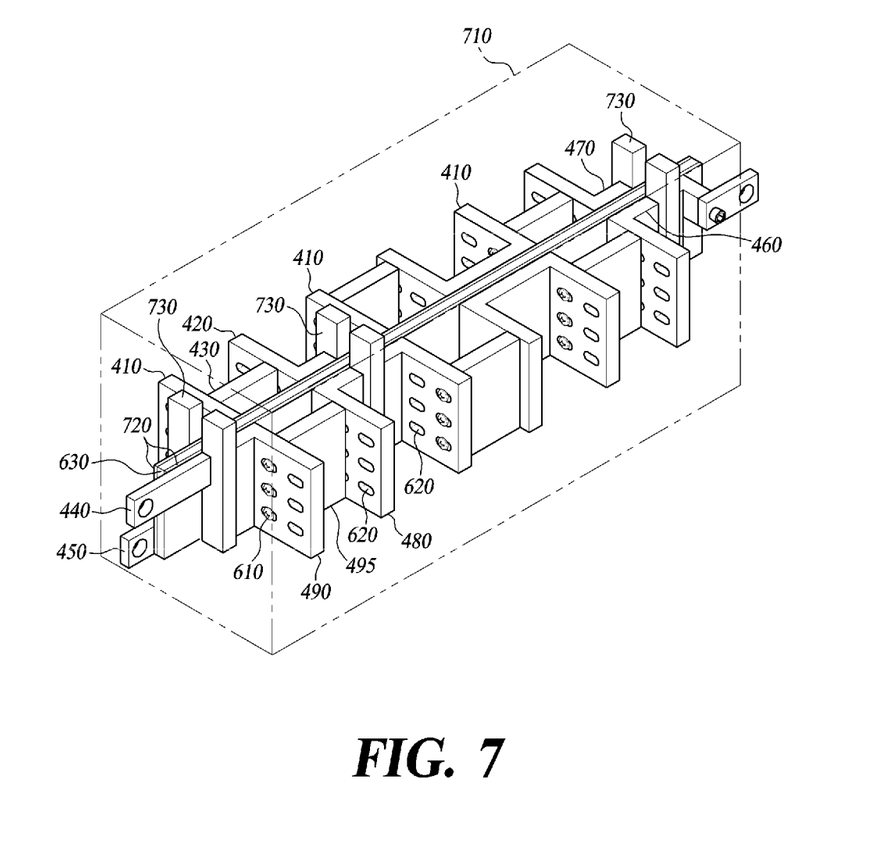
FIG. 7 is a perspective view of a low-pass filter with a variable inductor according to at least one embodiment.

FIG. 7 is a perspective view of a low pass filter using a variable inductor according to an embodiment of the present disclosure.

The drawing of FIG. 7 is a volumetric perspective view in the diagonal direction in the plan view of FIG. 6.

The first module and the second module are in symmetrical arrangement with indented profiles having respective series of bends in direct opposition to each other, and the two modules are joined together by supports 720 with the ground plate 630 interposed therebetween. The first module has one end connected to the first output terminal 440 and the other end connected to the second output terminal 470. The second module has one end connected to the second output terminal 460 and the other end connected to the first output terminal 440. The support plates 410, 420, 480 and 490 respectively have fastening holes 620 in one or more rows along one or more lines of contact with the connecting plates 430 and 495. The connecting plates have holes on their sides of contact with the support plates and therefore the contact side holes allow the support plates and connecting plates to meet along different adjustable lines. The resultant low pass filter may be electromagnetically shielded from surroundings in a case 710 of a conductive material, which is grounded. The ground plate 630 may be electrically connected to the case 710. In addition, the ground plate 630 may be inserted between the first and second modules with an insulating plate 720 interposed therebetween.

As described above, the present disclosure provides a high-power variable inductor by adjusting the cross sectional area of the platy inductor and can thereby remove a high-frequency noise.

Although exemplary embodiments of the present disclosure have been described for illustrative purposes, those skilled in the art will appreciate that various modifications, additions and substitutions are possible, without departing from the various characteristics of the disclosure. Therefore, exemplary embodiments of the present disclosure have been described for the sake of brevity and clarity. Accordingly, one of ordinary skill would understand the scope of the disclosure is not limited by the explicitly described above embodiments but by the claims and equivalents thereof.

What is claimed is:

1. A variable inductor, comprising:
    a first inductor connected to a first input terminal and to a second input terminal of a two-port circuit, the first inductor comprising:
        a first support plate and a second support plate arranged in parallel to each other for jointly supporting the first inductor; and
        a first connecting plate extending perpendicular to and connecting the first support plate and the second support plate together; and
    a second inductor connected to a first out terminal and to a second output terminal of the two-port circuit, the second inductor comprising:
        a third support plate and a fourth support plate arranged in parallel to each other for jointly supporting the second inductor; and
        a second connecting plate extending perpendicular to and connecting the third support plate and the fourth support plate together,
    wherein the first inductor and the second inductor are symmetrical to each other and each connecting plate is movable relative to respective support plates so that an area defined by the first inductor and the second inductor can be varied.

2. The variable inductor of claim 1, wherein the first connecting plate and the second connecting plate extend in parallel, the first support plate and the third support plate are coplanar with each other, and the second support plate and the fourth support plate are coplanar with each other.

3. The variable inductor of claim 1, wherein the first input terminal is electrically connected to the first support plate, the second input terminal is electrically connected to the second support plate, the first output terminal is electrically connected to the third support plate, and the second input terminal is electrically connected to the fourth support plate.

4. The variable inductor of claim 3, wherein the first inductor and the second inductor receive input currents which are in phase, and the input current to the first support plate is in the opposite direction of the input current to the third support plate.

5. The variable inductor of claim 3, wherein the first inductor and the second inductor have an interposed ground plane insulated from the first inductor and the second inductor.

6. The variable inductor of claim 3, wherein the first and the second support plates respectively have one or more fastening holes on contact lines between the first and the second support plates and the first connecting plate as the first connecting plate has a plurality of holes corresponding to the fastening holes and residing on contact planes between the first and the second support plates, and wherein the third and the fourth support plates respectively have one or more fastening holes on contact lines between the third and the fourth support plates and the second connecting plate as the second connecting plate has a plurality of holes corresponding to the fastening holes and residing on contact planes between the third and the fourth support plates.

7. The variable inductor of claim 6, wherein the first through the fourth support plates respectively have the fastening holes arranged in one or more rows.

8. The variable inductor of claim 1, further comprising means for movably fastening each connecting plate to respective support plates.

* * * * *